(12) United States Patent
Johnson

(10) Patent No.: US 6,345,994 B1
(45) Date of Patent: Feb. 12, 2002

(54) CIRCUIT BOARD SUPPORT CLIP

(75) Inventor: Greg P. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/231,307

(22) Filed: Jan. 13, 1999

(51) Int. Cl.[7] .................. H01R 13/648; H01R 4/58
(52) U.S. Cl. ........................ 439/95; 174/51; 361/758
(58) Field of Search .............. 439/95, 92, 101–108, 439/947; 361/408, 816, 758; 29/845; 174/51

(56) References Cited

U.S. PATENT DOCUMENTS

| | | | |
|---|---|---|---|
| 3,066,367 A | 12/1962 | Garman ..................... 24/81 |
| 3,777,052 A | 12/1973 | Fegen ..................... 174/138 |
| 3,996,500 A | 12/1976 | Coules ..................... 317/101 |
| 4,389,759 A | 6/1983 | Yuda | |
| 4,495,380 A | 1/1985 | Ryan et al. .............. 174/138 |
| 4,627,760 A | 12/1986 | Yagi et al. ............... 403/201 |
| 4,674,910 A | 6/1987 | Hayashi ................. 403/408.1 |
| 4,701,984 A | 10/1987 | Wyckoff ................... 24/573 |
| 4,855,873 A | 8/1989 | Bhargava et al. ........... 361/424 |
| 4,901,205 A | 2/1990 | Landis et al. ............. 361/424 |
| 4,938,703 A | 7/1990 | Nakano ..................... 439/74 |
| 4,954,087 A | * 9/1990 | Lauks et al. ............... 439/71 |
| 5,085,589 A | 2/1992 | Kan ........................ 439/92 |
| 5,138,529 A | 8/1992 | Colton et al. ............. 361/424 |
| 5,164,916 A | 11/1992 | Wu et al. .................. 364/52 |
| 5,191,513 A | 3/1993 | Sugiura et al. ............ 361/399 |
| 5,218,760 A | 6/1993 | Colton et al. .............. 29/845 |
| 5,225,629 A | 7/1993 | Garrett ................... 174/35 |
| 5,241,451 A | 8/1993 | Walburn et al. ............ 361/785 |
| 5,267,125 A | 11/1993 | Liu ........................ 361/816 |
| 5,452,184 A | 9/1995 | Scholder et al. ........... 361/799 |
| 5,467,254 A | 11/1995 | Brusati et al. ............ 361/799 |
| 5,490,038 A | 2/1996 | Scholder et al. ........... 361/759 |
| 5,513,996 A | 5/1996 | Anmerino et al. ........... 439/95 |
| 5,519,169 A | 5/1996 | Garrett et al. ............. 174/35 |
| 5,537,294 A | 7/1996 | Siwinski ................. 361/753 |
| 5,563,450 A | 10/1996 | Bader et al. .............. 257/785 |
| 5,647,748 A | 7/1997 | Mills et al. ............... 439/81 |
| 5,689,863 A | 11/1997 | Sinozaki ................... 24/297 |
| 5,691,504 A | 11/1997 | Sands et al. .............. 174/35 |
| 5,707,244 A | 1/1998 | Austin ..................... 439/95 |
| 5,754,412 A | 5/1998 | Clavin .................... 361/804 |
| 5,758,987 A | 6/1998 | Frame et al. .............. 403/298 |
| 5,796,593 A | 8/1998 | Mills et al. .............. 361/801 |
| 5,833,480 A | 11/1998 | Austin ..................... 439/95 |
| 5,865,518 A | 2/1999 | Jarrett et al. ........... 312/223.2 |
| 5,951,307 A | 9/1999 | Klein et al. ............... 439/92 |
| 5,953,217 A | 9/1999 | Klein et al. .............. 361/799 |
| 6,017,246 A | 1/2000 | Hisazumi et al. ........... 439/637 |
| 6,046,912 A | 4/2000 | Leman ..................... 361/784 |
| 6,186,800 B1 * | 2/2001 | Klein et al. ............... 439/95 |

OTHER PUBLICATIONS

U.S. application No. 08/988,863—"Motherboard Screwless Mounting Board"—filed Dec. 10, 1997.
U.S. application No. 09/231,306—"Circuit Board Ground and Support Structure"—filed Jan. 13, 1999.
U.S. application No. 08/988,946—"Method of Mounting A Motherboard To A Chassis"—filed Apr. 24, 2000.
U.S. application No. 09/472,728—"Method and Apparatus For Biasing A Circuit Board Into Engagement With A Computer Chassis"—filed Dec. 27, 1999.

* cited by examiner

*Primary Examiner*—Tho D. Ta
*Assistant Examiner*—Ann McCamey
(74) *Attorney, Agent, or Firm*—Perkins Coie LLP

(57) ABSTRACT

The present invention provides for an apparatus and method for supporting a circuit board such as a motherboard in the chassis of a computer. Embodiments of the apparatus provide for a circuit board support clip that supports the motherboard between a first and a second leg that cooperate to exert force on the circuit board in substantially opposite direction to support the circuit board.

25 Claims, 6 Drawing Sheets

CIRCUIT BOARD SUPPORT CLIP

TECHNICAL FIELD

The present invention is directed toward an apparatus and method for providing support for a printed circuit board in a computer system.

BACKGROUND OF THE INVENTION

There are two critical aspects of effectively connecting a computer component such as a printed circuit board to a computer system. First, a circuit board must be correctly electrically connected and grounded. Second and concurrently, the circuit board must be securely mechanically connected. For the sake of efficiency and the reduction of the number of required assembly parts, electrical grounding connection and mechanical connection are sometimes accomplished with the same assembly parts. A typical printed circuit board that is electrically grounded and mechanically connected within a computer system is a motherboard.

Electrical grounding of a computer chassis and the circuit boards within the chassis is essential to the optimal operation of a computer system. Grounding of an individual circuit board within the computer system allows a ground conductor material within a circuit board to block the electromagnetic interference (EMI) generated by the circuit board from interfering with other circuit boards within the computer system. A ground conductor is formed into a circuit board during circuit board fabrication. The ground conductor is a conductive element that extends across a planar portion of the circuit board. The ground conductor serves to electrically decouple EMI or cross-talk between electric devices on opposing sides of the ground conductor. By including a ground conductor in the circuit boards of a computer system, EMI among circuit boards can be reduced. In order for a ground conductor within a circuit board to be effective, the circuit board must be well connected to a ground source.

A typical ground source for a computer system is the ground supply of a building's electrical grid. The building's ground source is usually accessed through a standard wall socket. A computer power cord provides an electrical connection between the ground supply and the computer system. A ground wire of the power cord may be in turn connected to the computer chassis of the computer system. Grounding of the computer circuit boards is accomplished by making an electrical connection between each circuit board and the computer chassis. Alternatively, grounding may be a direct connection to grounding elements on a circuit board rather than through the circuit board connection to the chassis.

Grounding of the entire chassis provides protection to the circuit boards within the chassis. The grounded chassis not only protects a user from shock when touching a chassis energized by a short circuit, but also shields the circuit boards within the grounded chassis from EMI generated by external sources. In addition, the grounded chassis reduces electromagnetic emissions created by the computer circuit boards from interfering with other electrical devices located around the computer system by blocking those emissions.

Generally, mechanical connection of a computer circuit board to a computer chassis is designed to accomplish two goals. First, the connection should be adequately secure to prevent the circuit board from becoming dislodged under anticipated mechanical service loads. Second, the means for making the connection should be easily operable so that the circuit board may be efficiently installed in the computer system upon initial manufacture and so that removal and replacement of the circuit boards for the purpose of maintenance can be accomplished with reduced effort.

A conventional method of attaching computer circuit boards includes the use of screws. A screw can be placed through a hole in the circuit board, and thereby secure the circuit board to a part of a chassis. This type of connection also provides electrical connection when the screw urges a conductive surface of the circuit board onto a conductive part of the chassis. Connection with screws is not, however, considered an optimal method of connection. Screws require relatively large periods of time to install and remove. A loose screw that is misplaced within a computer chassis can cause great damage to the circuit boards by shorting between circuits not intended to make electrical contact. Additionally, if a screw is misdirected by an installer and the screw is forced against a portion of the circuit board, damage to the circuit board may be caused.

An improved device would provide a secure mechanical attachment without the use of screws or other conventional fasteners. Consequently, the tools required to attach and remove screws are fasteners would not be required. Avoidance of screws or fasteners or the tools needed to apply or remove them would significantly enhance the speed with which a circuit board such as a motherboard could be installed or removed from a computer system. An improved device may also provide a grounding path for the circuit board.

SUMMARY OF THE INVENTION

An embodiment of the invention is a circuit board support clip with a base having a first end and a second end opposite the first end. The support clip also has a first leg with a coupled end and a distal end. The coupled end of the first leg is coupled to the first end of the base. The first leg is for supporting a circuit board. A second leg has a coupled end and a distal end. The coupled end of the second leg is coupled to the second end of the base. The second leg is for supporting the circuit board. The first leg and the second leg are shaped to exert force on the circuit board in substantially opposite directions when the first leg and the second leg are supporting the circuit board.

Another embodiment of the invention is method of supporting a circuit board on a clip comprising the acts of: aligning two holes in the circuit board with distal ends of two legs of the clip; and pushing the circuit board toward a base of the clip until the legs are deflected to couple the circuit board with notches in the legs to restrict movement of the circuit board along longitudinal axes of the legs.

Yet another embodiment of the invention is a computer system with a chassis, a circuit board coupled to the chassis, and a circuit board support clip for coupling the circuit board to the chassis. The circuit board support clip includes a base having a first end and a second end opposite the first end. The circuit board support clip also includes a first leg having a coupled end and a distal end. The coupled end of the first leg is coupled to the first end of the base. The first leg is for supporting the circuit board. The circuit board support clip also has a second leg with a coupled end and a distal end. The coupled end of the second leg is coupled to the second end of the base. The second leg is for supporting the circuit board. The first leg and the second leg are shaped to exert force on the circuit board in substantially opposite directions when the first leg and the second leg are supporting the circuit board. The computer system also has a power supply coupled to the chassis and electrically connected to said circuit board, a central processing unit electrically connected to the circuit board, and a memory module electrically connected to the circuit board.

DETAILED DESCRIPTION OF THE INVENTION

Figure 1:
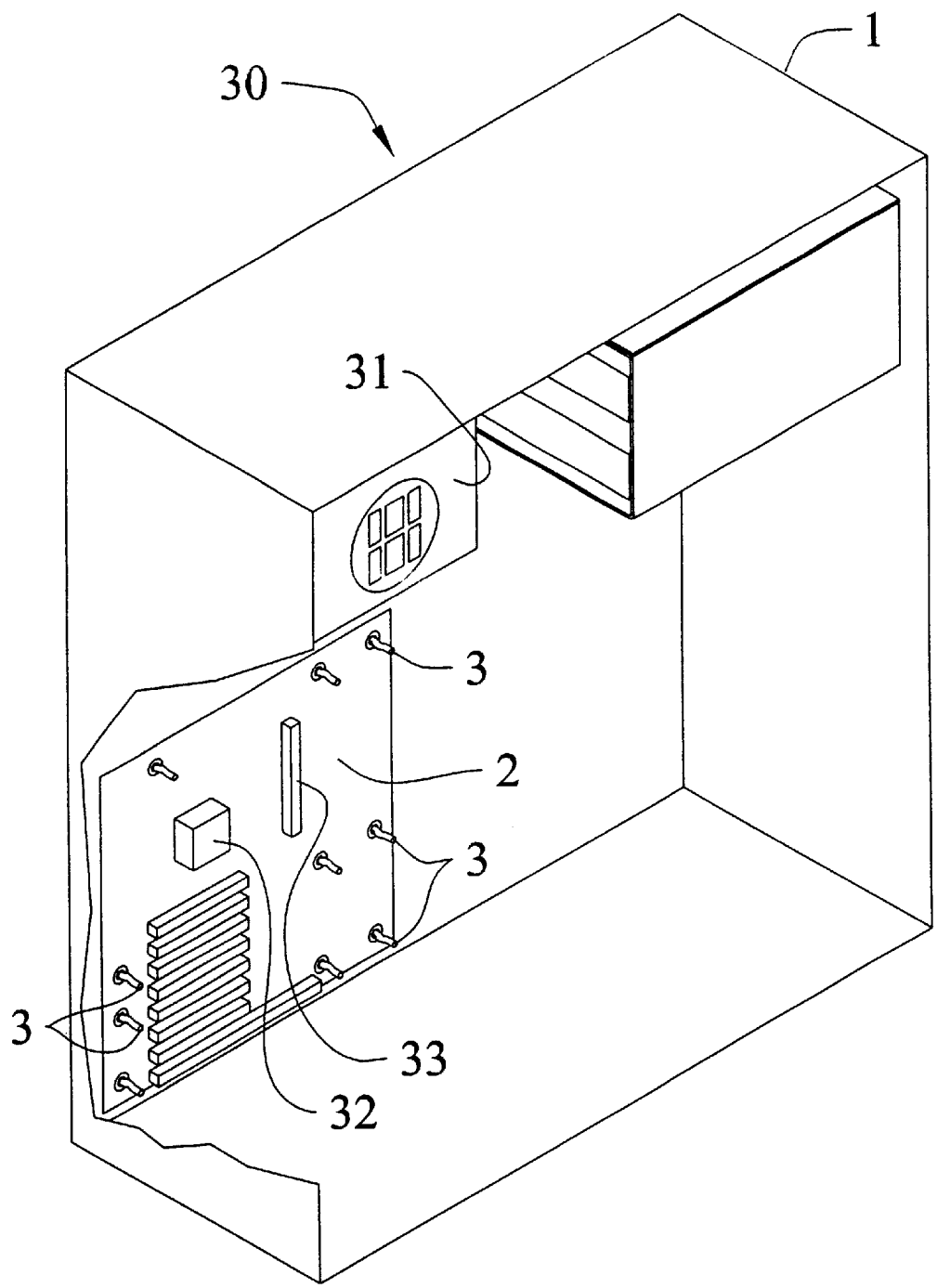
FIG. 1 is a perspective view of an embodiment of the invention showing a computer system with a motherboard coupled to a chassis with a plurality of circuit board support clips of the invention.
Figure 2:
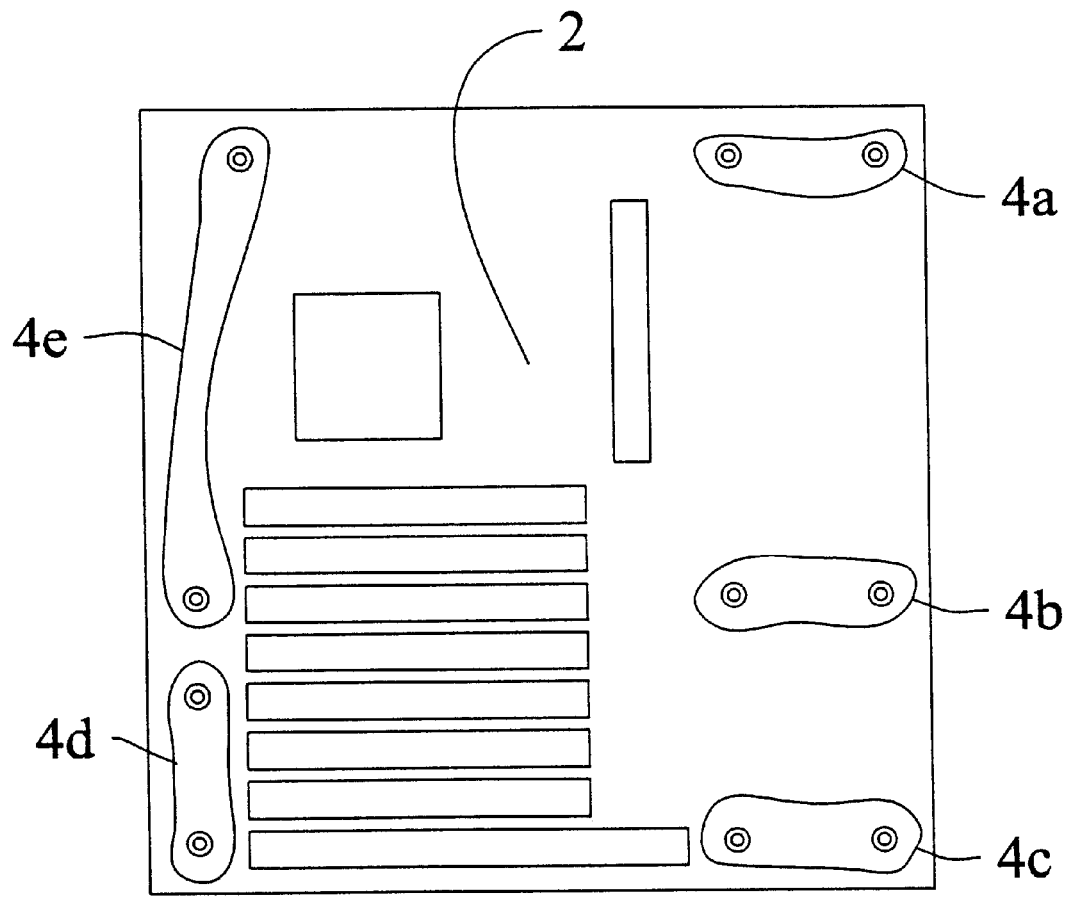
FIG. 2 is an elevation view of the motherboard of FIG. 1 illustrating a typical hole pattern in the motherboard.
Figure 3:
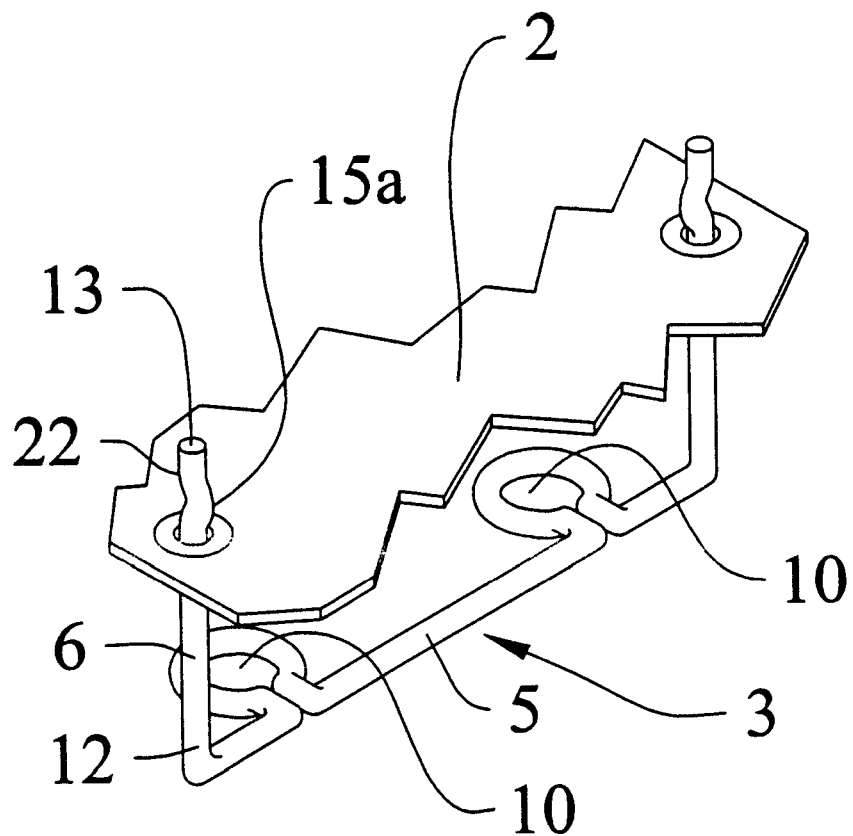
FIG. 3 is a perspective view of an embodiment of the invention with a portion of a circuit board being held in a support clip.

Embodiments of the present invention are directed toward an apparatus and method for supporting a circuit board, such as a motherboard, of a computer system. FIG. 1 shows a computer chassis 1 in which a motherboard 2 is mounted using circuit board support clips 3 of the invention. FIG. 3 shows a circuit board support clip 3 supporting a portion of a motherboard 2. FIG. 2 illustrates pairs of holes 4a–4e with which embodiments of the circuit board support clip 3 could be employed to support the motherboard 2. Note that the distance between holes in pair 4e is larger than the other hole pairs illustrated. The invention is equally applicable to use with hole pairs of varying widths. Furthermore, one or more of the holes in a motherboard could be connected with a conventional fastener such as a screw. Alternatively, in some embodiments some holes may not be engaged at all either by conventional fasteners or the support clip 3.

Figure 4:
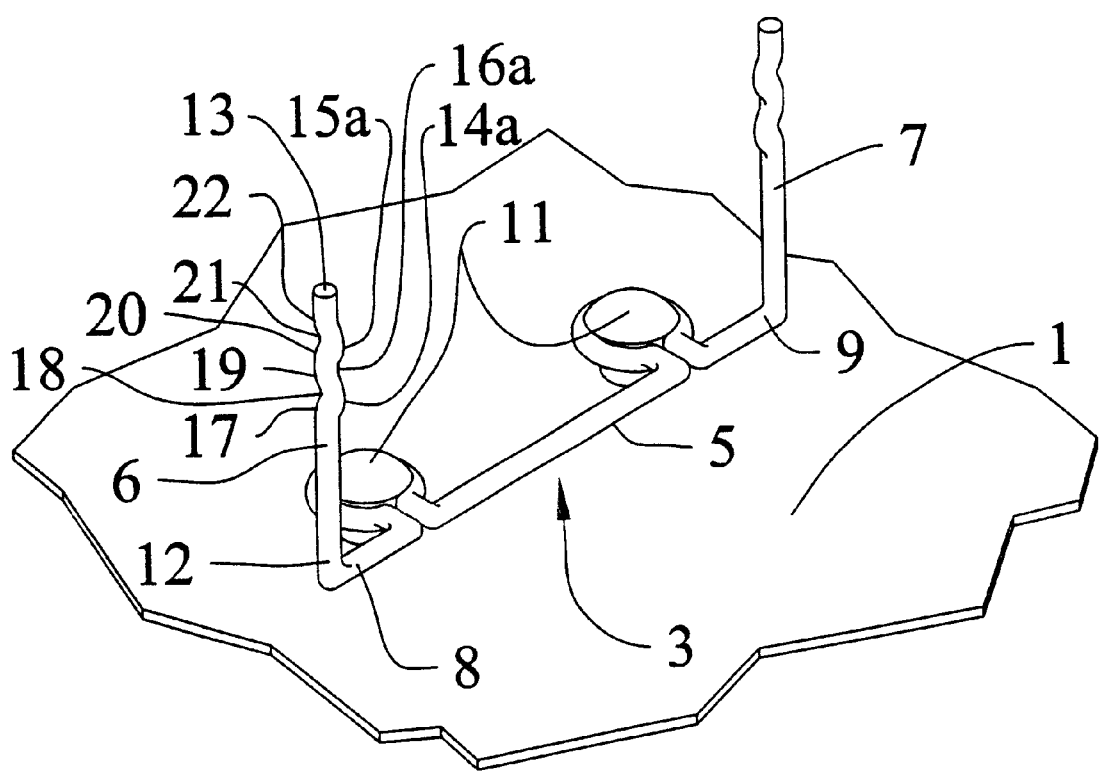
FIG. 4 is a perspective view of a support clip with legs for exerting force on a circuit board, each leg toward the other, for supporting the circuit board.

As is more easily seen in FIG. 4, the circuit board support clip 3 has a base 5, a first leg 6, and a second leg 7. When the first leg 6 and the second leg 7 are supporting the motherboard 2 (FIG. 3), the first leg 6 and the second leg 7 exert force on the motherboard 2 in substantially opposite directions to support the motherboard.

Base

As illustrated in FIG. 4, the base 5 has a first end 8 and a second end 9. The second end 9 is on the opposite end from the first end 8. The material from which the base 5 is formed may be a material that has a substantially round cross sectional area. In other embodiments, other material shapes would also serve well. In some embodiments, the base of the invention could include any part that connects the first leg 6 and the second leg 7. For instance, the base 5 might be a part of the chassis 1 through which electrical or mechanical connection could pass between a first leg 6 and a second leg 7.

The base 5 may be coupled to the computer chassis 1 to provide mechanical or electrical connection, or both mechanical and electrical connection, for the circuit board support clip 3. In the embodiment shown in FIG. 3, the base 5 includes openings 10 through which a fastener may extend to couple the base 5 to the computer chassis 1. As shown in FIG. 3, an extent of the opening 10 is defined by a portion of the base 5 disposed circumferentially about the opening 10. That is, a portion of the base 5 has been bent about the circumference of the opening 10 to form the opening. A fastener 11 is illustrated in FIG. 4. The fastener 11 shown is a rivet, but other fasteners such as screws or bolts could be used as well. In other embodiments, the coupling of the base 5 to the chassis 1 could be accomplished by use of soldering, welding, adhesives, or any other adequate means.

First Leg

As shown in FIG. 4, the circuit board clip 3 has a first leg 6 with a coupled end 12 and a distal end 13. The coupled end 12 is coupled to the first end 8 of the base 5. The first leg 6 is for supporting the motherboard 2 (FIG. 3). The first leg 6 may contain bends to create a first ridge 14a and a second ridge 15a as shown in FIG. 4. In some embodiments, the first ridge 14a can act even without the second ridge 15a to support the circuit board to restrict movement of the circuit board along a longitudinal axis of the first leg 6. As shown in FIG. 4, the longitudinal axis of the first leg 6 is the vertical axis.

Figure 6:
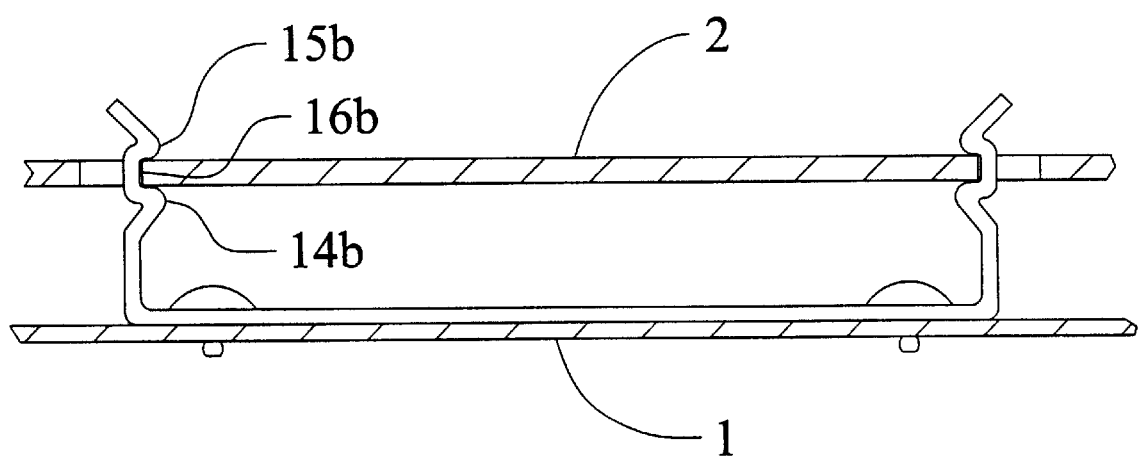
FIG. 6 is an elevation view of an embodiment of the invention.

As illustrated, a notch 16a is created between the first ridge 14a and the second ridge 15a. As is shown in FIG. 6, the first ridge 14b and the second ridge 15b may be formed by bends of varying degrees and still be within the scope of the invention. The notch 16b of FIG. 6 shows an alternate geometry as well. As illustrated in FIG. 4, the notch 16a as formed between the first ridge 14a and the second ridge 15a is for restricting movement of the circuit board along a longitudinal axis of the first leg 6. The function of the first ridge 14b and the second ridge 15b of FIG. 6 is substantially identical.

The first leg 6 illustrated in FIG. 4 is alternatively described as a series of six bends creating a first ridge 14a and a second ridge 15a. A first bend 17 is away from a longitudinal axis of the first leg 6. As shown, the longitudinal axis is a vertical axis. A second bend 18 is back toward the longitudinal axis of the first leg 6. A third bend 19, substantially aligns a portion of the first leg 6 beyond the third bend 19 with the longitudinal axis of the first leg 6. The portion of the first leg referred to here is the portion above the third bend 19 as illustrated in FIG. 4. In some embodiments, the three bends used to create the first ridge 14a are adequate to support the motherboard 2 (FIG. 3) to restrict movement of the circuit board along the longitudinal axis of the first leg 6.

Continuing to describe the six bends of the embodiment illustrated in FIG. 4, a fourth bend 20 is made away from the longitudinal axis of the first leg 6. A fifth bend 21 toward the longitudinal axis of the first leg coincides with the peak of the second ridge 15a. A sixth bend 22 substantially aligns a portion of the first leg 6 beyond the sixth bend 22 with the longitudinal axis of the first leg 6. The portion of the first leg 6 beyond the sixth bend 22 is the portion above the sixth bend 22 as shown in FIG. 4.

Figure 5:
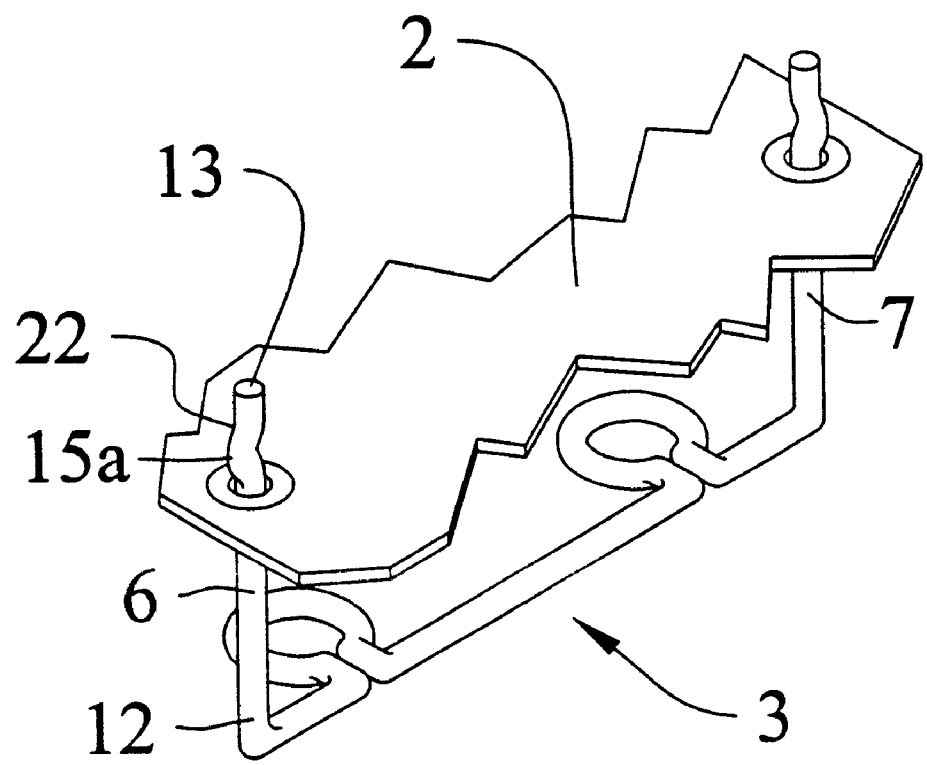
FIG. 5 is a perspective view of a portion of a circuit board and a support clip with legs for exerting force on a circuit board, each leg away from the other, for supporting the circuit board.

In embodiments of the invention, the angle formed in the first leg 6 by the sixth bend 22 is an obtuse angle. Therefore, by pushing the circuit board 2 along the longitudinal axis of the first leg 6 toward the coupled end 12, the first leg is deflected and moved into position to support the circuit board 2 as shown in FIGS. 3 and 5. Pushing the circuit board 2 over the sixth bend 22 as shown in FIG. 3 causes the distal end 13 to be deflected away from the center of the clip 3 until the circuit board 2 passes over the second ridge 15a. At that point the first leg 6 moves back into position to support the circuit board 2. As shown in FIG. 5, pushing the circuit board 2 over the sixth bend 22 causes the distal end 13 to be deflected toward the center of the clip 3 until the circuit board passes over the second ridge 15a. The first leg 6 then moves back into position to support the circuit board 2.

As shown in FIGS. 3–5, the first leg is formed from a material that has a substantially round cross sectional area. However, materials in other shapes could also be used.

Second Leg

As illustrated in FIGS. 3–5, the second leg 7 is a mirror image of the first leg 6. The mirror image point is the longitudinal center point of the base 5. Therefore, in the embodiments illustrated, the shape and function of the second leg 7 is substantially identical to the first leg 6.

The first leg 6 and the second leg 7 are shaped to work together to exert force on the circuit board 2 in substantially opposite directions when the circuit board is being supported by the first and second legs as shown in FIGS. 3, 5, and 6. As illustrated in FIG. 3, the first leg 6 exerts a force on the circuit board 2 toward the second leg 7. Consequently, the second leg 7 exerts a force on the circuit board 2 toward the first leg 6. The circuit board 2 is being supported cooperatively by the first leg 6 and the second leg 7. The embodiment illustrated in FIG. 6 is substantially similar in how the circuit board 2 is supported.

The embodiment shown in FIG. 5 supports the circuit board 2 by applying support in the opposite direction to the embodiment shown in FIG. 3. In the embodiment of FIG. 5, the first leg 6 exerts a force on the circuit board 2 away form the second leg 7. The second leg exerts a force on the circuit board 2 away from the first leg 6. These forces are exerted when the circuit board 2 is being supported by the first leg 6 and the second leg 7.

In some embodiments, the base 5, the first leg 6, and the second leg 7 are a single piece of spring steel. In other embodiments, each may be a separate piece coupled together to create a circuit board support clip 3. Additionally, many other materials are within the scope of the invention and could be used to construct the invention.

In some embodiments, the circuit board support clip 3 is also a grounding clip for providing an electrical ground connection between the circuit board 2 and a grounding source. In some embodiments, the grounding source to which the circuit board is attached is the computer chassis 1.

A Method of Supporting a Circuit Board

An embodiment of the invention is a method of supporting a circuit board. This method may be accomplished with embodiments of the invention described above and illustrated in FIGS. 1–6. The method includes a first act of aligning two holes in the circuit board with distal ends of two legs of a clip. In some embodiments, a second act is to deflect the distal ends of the legs of the clip toward one another prior to pushing the circuit board into the notches in the legs. This second act may be useful when operating an embodiment of the invention as illustrated in FIG. 5. In other embodiments, the second act may be to deflect the distal ends of the legs of the clip away from one another prior to pushing the circuit board into the notches in the legs. This second act may be useful when operating an embodiment of the invention as illustrated in FIG. 3.

A final act of method may be to push the circuit board toward the base of the clip until the legs are deflected to couple the circuit board with notches in the legs. When the circuit board is coupled in the notches, movement of the circuit board along longitudinal axes of the legs is restricted.

Computer System

As illustrated in FIG. 1, an embodiment of the invention is a computer system 30 with a chassis 1 having a circuit board such as a motherboard 2 coupled to the chassis. The motherboard 2 is coupled to the chassis 1 with one or more circuit board support clips 3. The circuit board support clip 3 comprises: a base having a first end and a second end opposite the first end; a first leg having a coupled end and a distal end, the coupled end of the first leg being coupled to the first end of the base, the first leg for supporting the motherboard 2; and a second leg having a coupled end and a distal end, the coupled end of the second leg being coupled to the second end of the base, the second leg for supporting the motherboard 2. The first leg and the second leg are shaped to exert force on the motherboard 2 in substantially opposite directions when the first leg and the second leg are supporting the motherboard 2. Embodiments of the clip 3 are substantially identical to the clip 3 described in detail in sections above.

The computer system 30 may also have a power supply 31 coupled to the chassis 1 and electrically connected to the motherboard 2. The computer system 30 may also include a central processing unit 32 electrically connected to the motherboard 2, and a memory module 33 electrically connected to the motherboard.

From the foregoing it will be appreciated that, although specific embodiments of the invention have been described herein for purposes of illustration, various modification may be made without deviating from the spirit and scope of the invention. Accordingly, the invention is not limited except as by the claims.

ADVANTAGES OF THE INVENTION

The invention provides for attachment of a circuit board such as a motherboard to a computer chassis without the use of tools conventionally required to secure fasteners. No conventional fasteners such as screws or bolts are required. The mechanical attachment provided is not only quickly and easily operable, but also enables a secure mechanical connection. Embodiments of the invention also provide an effective grounding connection for a circuit board. Therefore, through the use of the invention, quick and simplified mechanical and electrical connection of a circuit board is accomplished.

What is claimed is:

1. A circuit board assembly comprising:
   a circuit board having a first hole and a second hole spaced apart from the first hole;
   a support clip coupled to the circuit board, the support clip having:
   a base having a first end and a second end opposite the first end; and
   a first leg having a coupled end and a distal end, the coupled end of said first leg being coupled to the first end of said base, and the distal end of said first leg being received in the first hole of the circuit board; and
   a second leg having a coupled end and a distal end, the coupled end of said second leg being coupled to the second end of said base, and the distal end of said second leg being received in the second hole of the circuit board;
   wherein said first leg and said second leg are shaped to exert force on the circuit board in substantially opposite directions when said first leg and said second leg are received in the first and second holes, respectively.

2. The circuit board assembly of claim 1 wherein said first leg contains bends to create a ridge in said first leg, the ridge for supporting the circuit board to restrict movement of the circuit board along a longitudinal axis of the first leg.

3. The circuit board assembly of claim 1 wherein said first leg contains at least three bends to create a ridge for supporting the circuit board to restrict movement of the circuit board along a longitudinal axis of the first leg, the three bends comprising:
- a first bend away from the longitudinal axis of said first leg,
- a second bend toward the longitudinal axis of the said first leg, and
- a third bend to substantially align a portion of said first leg beyond the third bend with the longitudinal axis of the first leg.

4. The circuit board assembly of claim 1 wherein said first leg is formed from a material that has a substantially round cross sectional area.

5. The circuit board assembly of claim 1 wherein said second leg contains a bend to create a ridge in said second leg, the ridge for supporting the circuit board to restrict movement of the circuit board along a longitudinal axis of said second leg.

6. The circuit board assembly of claim 1 wherein said second leg contains at least three bends to create a ridge for supporting the circuit board to restrict movement of the circuit board along a longitudinal axis of said second leg, the three bends comprising:
- a first bend away from the longitudinal axis of said second leg,
- a second bend toward the longitudinal axis of the said second leg, and
- a third bend to substantially align a portion of said second leg beyond the third bend with the longitudinal axis of said second leg.

7. The circuit board assembly of claim 1 wherein said second leg is formed from a material that has a substantially round cross sectional area.

8. The circuit board assembly of claim 1 wherein said first leg exerts a force on the circuit board away from said second leg and said second leg exerts a force on the circuit board away from said first leg when the circuit board is being supported by said first leg and said second leg.

9. The circuit board assembly of claim 1 wherein said base, said first leg, and said second leg are a single piece of spring steel.

10. The circuit board assembly of claim 1 wherein the circuit board support clip is a grounding clip for providing an electrical ground connection between the circuit board and a grounding source.

11. A circuit board assembly comprising:
- a circuit board having a first hole and a second hole spaced apart from the first hole; and
- a base having a first end and a second end opposite the first end, wherein said base is formed from a material that has a substantially round cross sectional area;
- a first leg having a coupled end and a distal end, the coupled end of said first leg being coupled to the first end of said base, said first leg being received in the first hole of the circuit board; and
- a second leg having a coupled end and a distal end, the coupled end of said second leg being coupled to the second end of said base, said second leg being received in the second hole of the circuit board;
- wherein said first leg and said second leg are shaped to exert force on the circuit board in substantially opposite directions when said first leg and said second leg are supporting the circuit board.

12. A circuit board support clip comprising:
- a base having a first end and a second end opposite the first end, wherein said base includes an opening through which a fastener extends to couple said base to a computer chassis;
- a first leg having a coupled end and a distal end, the coupled end of said first leg being coupled to the first end of said base, said first leg for supporting a circuit board; and
- a second leg having a coupled end and a distal end, the coupled end of said second leg being coupled to the second end of said base, said second leg for supporting the circuit board;
- wherein said first leg and said second leg are shaped to exert force on the circuit board in substantially opposite directions when said first leg and said second leg are supporting the circuit board.

13. The circuit board support clip of claim 12 wherein an extent of the opening is defined by a portion of said base disposed circumferentially about the opening.

14. A circuit board support clip comprising:
- a base having a first end and a second end opposite the first end;
- a first leg having a coupled end and a distal end, the coupled end of said first leg being coupled to the first end of said base, said first leg for supporting a circuit board, wherein said first leg contains bends to create a first ridge and a second ridge in said first leg, whereby there is a notch between the first ridge and the second ridge, the notch for restricting movement of the circuit board along a longitudinal axis of said first leg; and
- a second leg having a coupled end and a distal end, the coupled end of said second leg being coupled to the second end of said base, said second leg for supporting the circuit board;
- wherein said first leg and said second leg are shaped to exert force on the circuit board in substantially opposite directions when said first leg and said second leg are supporting the circuit board.

15. A circuit board support clip comprising:
- a base having a first end and a second end opposite the first end;
- a first leg having a coupled end and a distal end, the coupled end of said first leg being coupled to the first end of said base, said first leg for supporting a circuit board, wherein said first leg contains at least six bends to create a first ridge and a second ridge to restrict movement of the circuit board along a longitudinal axis of said first leg, the six bends comprising:
  - a first bend away from the longitudinal axis of said first leg,
  - a second bend toward the longitudinal axis of the said first leg,
  - a third bend to substantially align a portion of said first leg beyond the third bend with the longitudinal axis of said first leg,
  - a fourth bend away from the longitudinal axis of said first leg,
  - a fifth bend toward the longitudinal axis of said first leg, and
  - a sixth bend to substantially align a portion of said first leg beyond the sixth bend with the longitudinal axis of said first leg; and a second leg having a coupled end and a distal end, the coupled end of said second leg being coupled to the second end of said base, said second leg for supporting the circuit board;

wherein said first leg and said second leg are shaped to exert force on the circuit board in substantially opposite directions when said first leg and said second leg are supporting the circuit board.

16. The circuit board support clip of claim 15 wherein an angle formed in said first leg by the sixth bend is an obtuse angle such that by pushing the circuit board along the longitudinal axis of said first leg toward the coupled end, said first leg is deflected and moved into position to support the circuit board.

17. A circuit board support clip comprising:

a base having a first end and a second end opposite the first end;

a first leg having a coupled end and a distal end, the coupled end of said first leg being coupled to the first end of said base, said first leg for supporting a circuit board through a first hole in the circuit board; and a second leg having a coupled end and a distal end, the coupled end of said second leg being coupled to the second end of said base, said second leg for supporting the circuit board through a second hole in the circuit board;

wherein said first leg and said second leg are shaped to exert force on the circuit board in substantially opposite directions when said first leg and said second leg are supporting the circuit board; and wherein said second leg contains bends to create a first ridge and a second ridge in said second leg, whereby there is a notch between the first ridge and the second ridge, the notch for restricting movement of the circuit board along a longitudinal axis of said second leg.

18. A circuit board support clip comprising:

a base having a first end and a second end opposite the first end;

a first leg having a coupled end and a distal end, the coupled end of said first leg being coupled to the first end of said base, said first leg for supporting a circuit board through a first hole in the circuit board; and a second leg having a coupled end and a distal end, the coupled end of said second leg being coupled to the second end of said base, said second leg for supporting the circuit board through a second hole in the circuit board;

wherein said first leg and said second leg are shaped to exert force on the circuit board in substantially opposite directions when said first leg and said second leg are supporting the circuit board; and wherein said second leg contains at least six bends to create a first ridge and a second ridge to restrict movement of the circuit board along a longitudinal axis of said second leg, the six bends comprising:

a first bend away from the longitudinal axis of said second leg, a second bend toward the longitudinal axis of the second leg, a third bend to substantially align a portion of said second leg beyond the third bend with the longitudinal axis of said second leg, a fourth bend away from the longitudinal axis of the second leg, a fifth bend toward the longitudinal axis of the said second leg, and a sixth bend to substantially align a portion of said second leg beyond the sixth bend with the longitudinal axis of said second leg.

19. A circuit board support clip comprising:

a base having a first end and a second end opposite the first end;

a first leg having a coupled end and a distal end, the coupled end of said first leg being coupled to the first end of said base, said first leg for supporting a circuit board through a first hole in the circuit board; and a second leg having a coupled end and a distal end, the coupled end of said second leg being coupled to the second end of said base, said second leg for supporting the circuit board through a second hole in the circuit board;

wherein said first leg and said second leg are shaped to exert force on the circuit board in substantially opposite directions when said first leg and said second leg are supporting the circuit board;

wherein said second leg contains at least six bends to create a first ridge and a second ridge to restrict movement of the circuit board along a longitudinal axis of said second leg, the six bends comprising:

a first bend away from the longitudinal axis of said second leg, a second bend toward the longitudinal axis of the second leg, a third bend to substantially align a portion of said second leg beyond the third bend with the longitudinal axis of said second leg, a fourth bend away from the longitudinal axis of the second leg, a fifth bend toward the longitudinal axis of the said second leg, and a sixth bend to substantially align a portion of said second leg beyond the sixth bend with the longitudinal axis of said second leg; and wherein an angle formed in said second leg by the sixth bend is an obtuse angle such that by pushing the circuit board along the longitudinal axis of said first leg toward the coupled end, said first leg is deflected and moved into position to support the circuit board.

20. A circuit board support clip comprising:

a base having a first end and a second end opposite the first end;

a first leg having a coupled end and a distal end, the coupled end of said first leg being coupled to the first end of said base, said first leg for supporting a circuit board; and a second leg having a coupled end and a distal end, the coupled end of said second leg being coupled to the second end of said base, said second leg for supporting the circuit board;

wherein said first leg exerts a force on the circuit board toward said second leg and said second leg exerts a force on the circuit board toward said first leg when the circuit board is being supported by said first leg and said second leg.

21. A circuit board support clip comprising:

a base having a first end and a second end opposite the first end wherein said base:

is formed from a material that has a substantially round cross sectional area, and has an opening through which a fastener extends to couple said base to the computer chassis, an extent of the opening being defined by a portion of said base disposed circumferentially about the opening;

a first leg having a coupled end and a distal end, the coupled end of said first leg being coupled to the first end of said base, said first leg for supporting a circuit board wherein said first leg contains at least six bends to create a first ridge and a second ridge to restrict movement of the circuit board along a longitudinal axis of said first leg, the six bends comprising:

a first bend away from the longitudinal axis of said first leg, a second bend toward the longitudinal axis of the said first leg, a third bend to substantially align a portion of said first leg beyond the third bend with the longitudinal axis of said first leg, a fourth bend away from the longitudinal axis of said first leg, a fifth bend toward the longitudinal axis of the said first leg, and a sixth bend to substantially align a portion of said first leg beyond the sixth bend with the longitudinal axis of said first leg, wherein the angle formed in said first leg by the sixth bend is an obtuse angle such that by pushing the circuit board along the longitudinal axis of said first leg toward the coupled end, said first leg is deflected and moved into position to support the circuit board; and a second leg having a coupled end and a distal end, the coupled end of said second leg being coupled to the second end of said base, said second leg for supporting the circuit board, wherein said second leg contains bends to create a first ridge and a second ridge in said second leg, whereby there is a notch between the first ridge and the second ridge, the notch for restricting movement of the circuit board along a longitudinal axis of said second leg;

wherein said first leg and said second leg are shaped to exert force on the circuit board in substantially opposite directions when said first leg and said second leg are supporting the circuit board;

wherein said base, said first leg, an d said second leg are a single piece of spring steel.

22. A method of supporting a circuit board on a clip comprising the acts of:

aligning two holes in the circuit board with distal ends of two legs of the clip; and pushing the circuit board toward a base of the clip until the legs are deflected to couple the circuit board with notches in the legs to restrict movement of the circuit board along longitudinal axes of the legs.

23. The method of supporting a circuit board of claim 22 further comprising the act of deflecting the distal ends of the legs of the clip toward one another prior to pushing the circuit board into the notches in the legs.

24. The method of supporting a circuit board of claim 22 further comprising the act of deflecting the distal ends of the legs of the clip away from one another prior to pushing the circuit board into the notches in the legs.

25. A computer system comprising:

a chassis;

a circuit board coupled to said chassis;

a circuit board support clip for coupling said circuit board to said chassis, said circuit board support clip comprising:

a base having a first end and a second end opposite the first end, the base including an opening through which a fastener extends to couple the base to said chassis;

a first leg having a coupled end and a distal end, the coupled end of the first leg being coupled to the first end of the base, the first leg for supporting said circuit board; and a second leg having a coupled end and a distal end, the coupled end of the second leg being coupled to the second end of the base, the second leg for supporting said circuit board;

wherein the first leg and the second leg are shaped to exert force on said circuit board in substantially opposite directions when the first leg and the second leg are supporting said circuit board;

a power supply coupled to the chassis and electrically connected to said circuit board;

a central processing unit electrically connected to the circuit board; and a memory module electrically connected to the circuit board.

* * * * *

UNITED STATES PATENT AND TRADEMARK OFFICE
CERTIFICATE OF CORRECTION

PATENT NO. : 6,345,994 B1
DATED : February 12, 2002
INVENTOR(S) : Johnson

It is certified that error appears in the above-identified patent and that said Letters Patent is hereby corrected as shown below:

Column 11,
Line 42, "an d" should be -- and --;

Signed and Sealed this

Fourth Day of March, 2003

JAMES E. ROGAN
*Director of the United States Patent and Trademark Office*